(12) United States Patent
Chen et al.

(10) Patent No.: US 8,537,523 B1
(45) Date of Patent: Sep. 17, 2013

(54) METHOD AND APPARATUS FOR IMPLEMENTING A METAL CAPACITOR WITH L-SHAPED FINGERS

(75) Inventors: Shuxian Chen, Fremont, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 451 days.

(21) Appl. No.: 12/378,115

(22) Filed: Feb. 11, 2009

(51) Int. Cl.
*H01G 4/005* (2006.01)
*H01G 4/38* (2006.01)

(52) U.S. Cl.
USPC .......................... 361/303; 361/328

(58) Field of Classification Search
USPC ................... 361/303, 328, 329, 330
See application file for complete search history.

(56) References Cited

U.S. PATENT DOCUMENTS

| | | |
|---|---|---|
| 4,409,608 A | 10/1983 | Yoder |
| 5,208,725 A | 5/1993 | Akcasu |
| 5,583,359 A | 12/1996 | Ng |
| 5,939,766 A | 8/1999 | Stolmeijer |
| 7,859,039 B2 * | 12/2010 | Yeh ................. 257/306 |
| 2007/0126078 A1 * | 6/2007 | Huang et al. .......... 257/532 |
| 2007/0268653 A1 * | 11/2007 | Kim et al. ............ 361/328 |
| 2007/0296013 A1 * | 12/2007 | Chang et al. .......... 257/306 |
| 2008/0158772 A1 * | 7/2008 | Hsien et al. ............ 361/306.3 |
| 2009/0091875 A1 * | 4/2009 | Yeh et al. .............. 361/303 |
| 2010/0067169 A1 * | 3/2010 | Wang .................. 361/303 |

OTHER PUBLICATIONS

Hirad Samavati, Ali Hajimiri, Arvin R. Shahani, Gitty N. Nasserbakht, and Thomas H. Lee, "Fractal Capacitors", IEEE Journal of Solid-State Ciruits, vol. 33, No. 12, Dec. 1998.

* cited by examiner

*Primary Examiner* — David M Sinclair
(74) *Attorney, Agent, or Firm* — L. Cho (57) ABSTRACT

A metal capacitor includes a plurality of interconnect segments. A first plurality of L-shaped fingers is driven to a first voltage level by a first interconnect segment. A second plurality of L-shaped fingers is driven to a second voltage level by a second interconnect segment. Each of the L-shaped fingers from a set of the first plurality of L-shaped fingers is adjacent to at least one of the L-shaped fingers from a set of the second plurality of L-shaped fingers.

12 Claims, 6 Drawing Sheets

METHOD AND APPARATUS FOR IMPLEMENTING A METAL CAPACITOR WITH L-SHAPED FINGERS

TECHNICAL FIELD

Embodiments of the present invention relate to capacitor-based circuits. More specifically, embodiments of the present invention relate to a method and apparatus for implementing a metal capacitor with L-shaped fingers.

BACKGROUND

Metal capacitors are important components that may be used in transceivers such as in a high speed serial interface. Metal capacitors are also used in other analog circuits such as high pass and low pass filters and other components. Generally, a high quality factor, Q, is desirable for high performance. The quality factor is defined as energy stored in a capacitor divided by the energy dissipated by parasitic resistance.

Two types of structures have been commonly used to implement metal capacitors. The first type of structure included the use of long parallel metal lines on each layer of a semiconductor device, where the metal lines were also parallel between layers of the semiconductor device when multiple layers were used. Using long parallel metal lines biased at different potentials produced a high inductive effect on the metal capacitor during high frequency applications. This would result in fluctuations in the capacitance of the metal capacitor which was undesirable during high frequency applications.

The second type of structure is known as a rotative metal-oxide-metal (RTMOM) capacitor. Similar to the first structure, RTMOM capacitors utilized parallel metal lines on each layer of a semiconductor device. However, RTMOM capacitors used multiple layers where each layer positions its parallel metal lines perpendicular to the parallel metal lines on adjacent layers to form a woven line appearance. The inter layer coupling for the woven line style of the RTMOM capacitors proved to be inefficient. Lower capacitance density resulted as a larger line space was required to implement the RTMOM capacitors due to reliability concern under applications where voltage drops higher than nominal.

SUMMARY

According to an embodiment of the present invention, a metal capacitor includes a plurality of interconnect segments and a plurality of L-shaped fingers. The L-shaped fingers may be configured at different widths and lengths. L-shaped fingers on a same metal layer are biased at alternative potential to immediate neighboring L-shaped fingers. Parallel L-shaped fingers from adjacent metal layers (below or above) are also biased at alternative potentials. According to an embodiment of the present invention, each metal capacitor may reside in a capacitor cell that includes 4 parts that are diagonally mirrored. The capacitor cells may be arrayed to meet capacitance target.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily. Additionally, some embodiments of the invention are described in the context of field programmable gate arrays ("FPGA"), but the invention is applicable to other contexts as well, including other semiconductor devices such as programmable logic devices, complex programmable logic devices, application specific integrated circuits, processors, controllers and memory devices.

Figure 1:
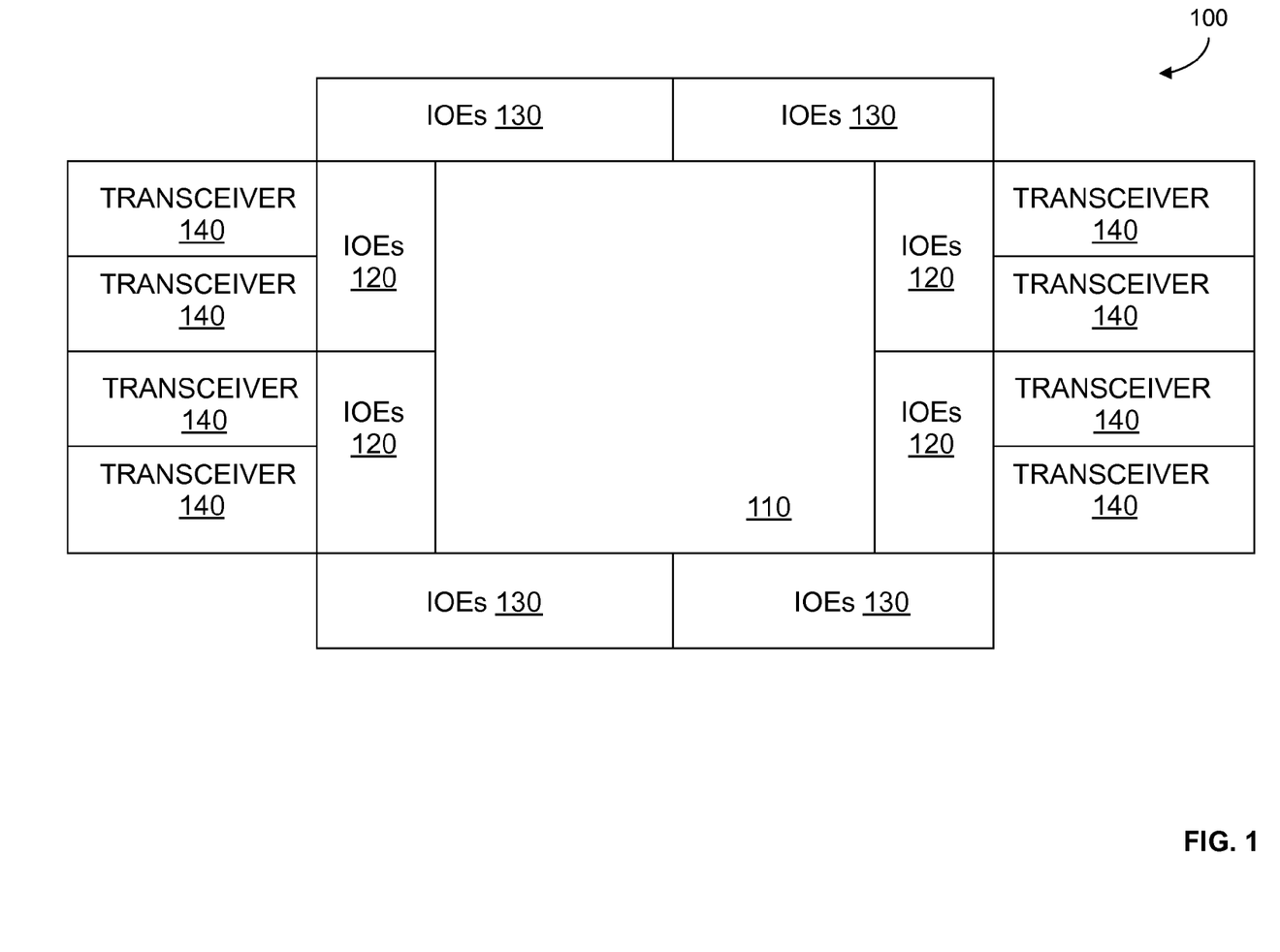
FIG. 1 illustrates a target device in which a metal capacitor may be implemented on according to an exemplary embodiment of the present invention.

FIG. 1 illustrates a device 100 which implements metal capacitors according to an exemplary embodiment of the present invention. In this example, the device 100 is a target device such as an FPGA which a system may be implemented on. The target device 100 may be a semiconductor device having a hierarchical structure that may take advantage of wiring locality properties of circuits formed therein.

The target device 100 includes an FPGA fabric 110. The FPGA fabric 110 may include logic elements. Each logic element may be grouped into one of a plurality of logic-array blocks (LABs). Each LAB may be formed from a plurality of logic elements, carry chains, LAB control signals, (lookup table) LUT chain, and register chain connection lines. A logic element is a small unit of logic providing efficient implementation of user logic functions. LABs are grouped into rows and columns across the FPGA fabric 110. The FPGA fabric 110 may also include DSP blocks. The DSP blocks may be used to implement multipliers of various configurations with add or subtract features. The DSP blocks include shift registers, multipliers, adders, and accumulators. The DSP blocks may be grouped into columns across the FPGA fabric 110. The FPGA fabric 110 may also include memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the FPGA fabric 110 in between selected LABs or located individually or in pairs within the target device 100.

The target device 100 includes a plurality of input/output elements (IOEs). Each IOE feeds an I/O pin (not shown) on the target device 100. The IOEs are located around the periphery of the target device 100. According to an embodiment of the present invention, some of the IOEs are general purpose IOE and high speed serial IOEs 120 while some of the IOEs are general purpose IOEs with memory interfaces 130. Each IOE includes a bidirectional I/O buffer and a plurality of registers for registering input, output, and output-enable signals. When used with dedicated clocks, the registers provide performance and interface support with external memory devices.

The target device 100 includes a plurality of transceiver blocks. Each transceiver block 140 includes a physical medium attachment (PMA) block, a physical coding sublayer (PCS) block, and PCI express block to support a plurality of channels that provide high aggregate data bandwidth and to support a wide range of protocols. Metal capacitors may be implemented in components in the transceiver block 140 such as high speed serial interfaces and high/low pass filters in the PMA block that operate in high frequencies.

FIG. 1 illustrates an exemplary embodiment of a target device. It should be appreciated that a system may include a plurality of target devices, such as that illustrated in FIG. 1, cascaded together. It should also be appreciated that, as indicated above, the target device may include the same or different semiconductor devices arranged in a different manner. A target device may also include additional FPGA resources and/or FPGA resources other than those described in reference to the target device 100. Thus, while the invention described herein may be utilized on the architecture described in FIG. 1, it should be appreciated that it may also be utilized on different architectures and on different semiconductor devices.

Figure 2:
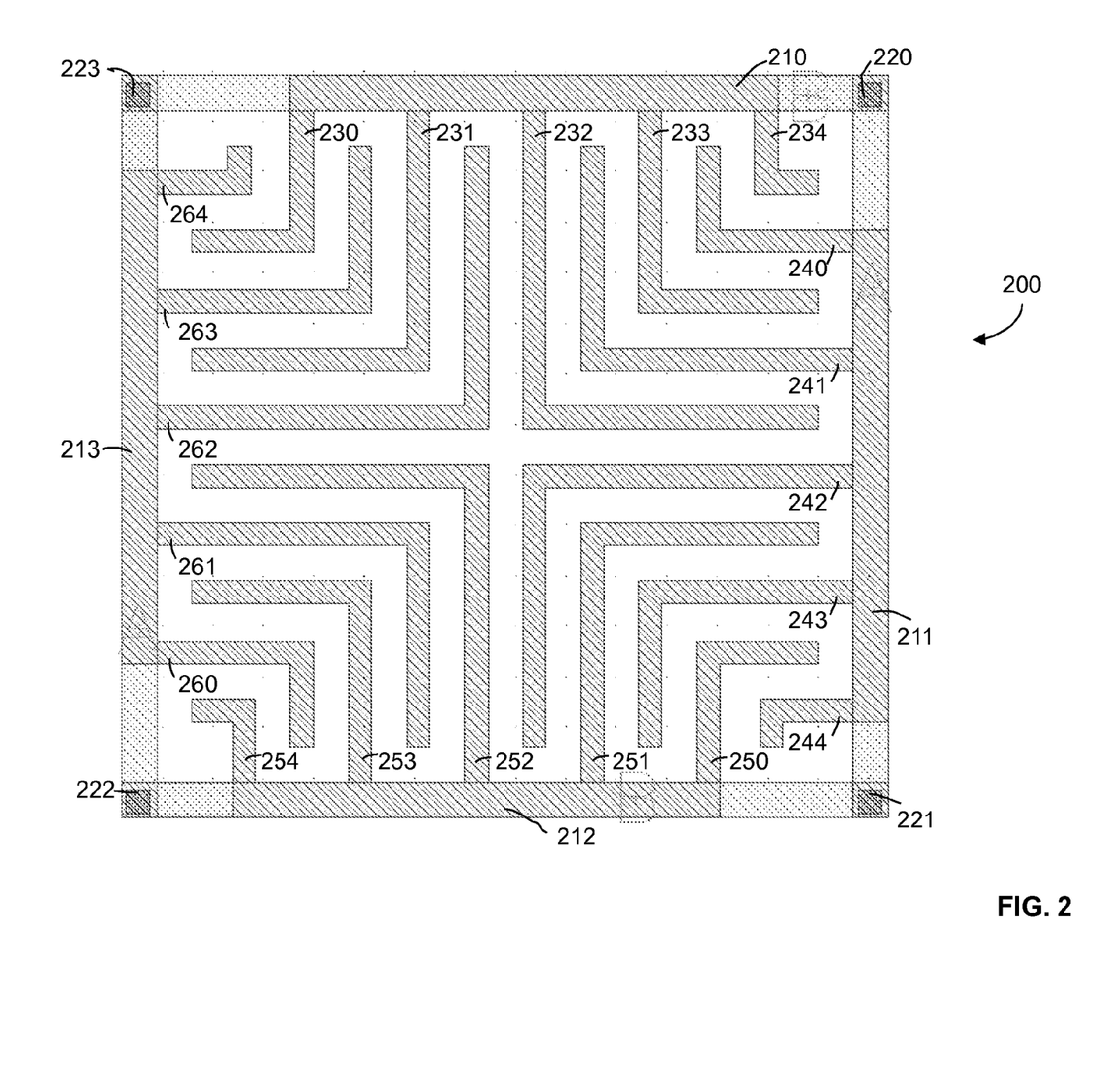
FIG. 2 illustrates a top view of a multi-layered metal capacitor according to an exemplary embodiment of the present invention.

FIG. 2 illustrates a top view of a multi-layered metal capacitor 200 according to an exemplary embodiment of the present invention. On the top layer of the capacitor 200 is a first interconnect segment 210, a second interconnect segment 211, a third interconnect segment 212, and a fourth interconnect segment 213. The first interconnect segment 210 is coupled to a first terminal 220. The second interconnect segment 211 is coupled to a second terminal 221. The third interconnect segment 212 is coupled to a third terminal 222. The fourth interconnect segment 213 is coupled to a fourth terminal 223. The terminals 221-223 are coupled to a voltage source or ground to drive the interconnect segments to a voltage level. According to an embodiment of the present invention, the first terminal 220 and the third terminal 222 are coupled to a first voltage source to drive the first interconnect segment 210 and the third interconnect segment 212 to a first voltage level and the second terminal 221 and the fourth terminal 223 are coupled to ground to drive the second interconnect 212 and the fourth interconnect 213 to a second voltage level.

The capacitor 200 includes a plurality of L-shaped fingers. Each L-shaped finger is coupled to one of the interconnect segments 210-213. A first plurality of L-shaped fingers 230-234 are coupled to and are driven to the first voltage level by the first interconnect segment 210. A second plurality of L-shaped fingers 240-244 are coupled to and driven to the second voltage level by the second interconnect segment 211. A third plurality of L-shaped fingers 250-254 are coupled to and driven to the first voltage level by the third interconnect segment 212. A fourth plurality of L-shaped fingers 260-264 are coupled to and driven to the second voltage level by the fourth interconnect segment 213. According to an embodiment of the present invention, only the L-shaped fingers contribute to the capacitance density of the capacitor 200 without contributing to the parasitic capacitance of the capacitor 200. In this embodiment, the interconnect segments contribute only to the parasitic capacitance of the capacitor 200.

According to an embodiment of the present invention, each of the interconnect segments 210-213 are positioned at right angles to two other interconnect segments to form a parallelogram shape such as a square or rectangle. Each L-shaped finger is configured to be adjacent to at least one other L-shaped finger that is biased at a different voltage level such that L-shaped fingers on a same metal layer are biased at alternative potential to immediate neighbors. As shown in FIG. 2, each L-shaped finger from a first set of L-shaped fingers (232-234) from the first plurality of L-shaped fingers is adjacent to at least one of the L-shaped fingers from a first set of L-shaped fingers (240-241) of the second plurality of L-shaped fingers. Each L-shaped finger from a second set of L-shaped fingers (242-244) of the second plurality of L-shaped fingers is adjacent to at least one of the L-shaped fingers from a first set of L-shaped fingers (250-251) of the third plurality of L-shaped fingers. Each L-shaped finger from a second set of L-shaped fingers (252-254) of the third plurality of L-shaped fingers is adjacent to at least one of the L-shaped fingers from a first set of L-shaped fingers (260-261). Each L-shaped finger from a second set of L-shaped fingers (262-264) of the fourth plurality of L-shaped fingers is adjacent to at least one of the L-shaped fingers from a second set of L-shaped fingers (230-231) of the first plurality of L-shaped fingers. The capacitor 200 can be viewed as being composed of 4 parts that are diagonally mirrored.

Figure 3:
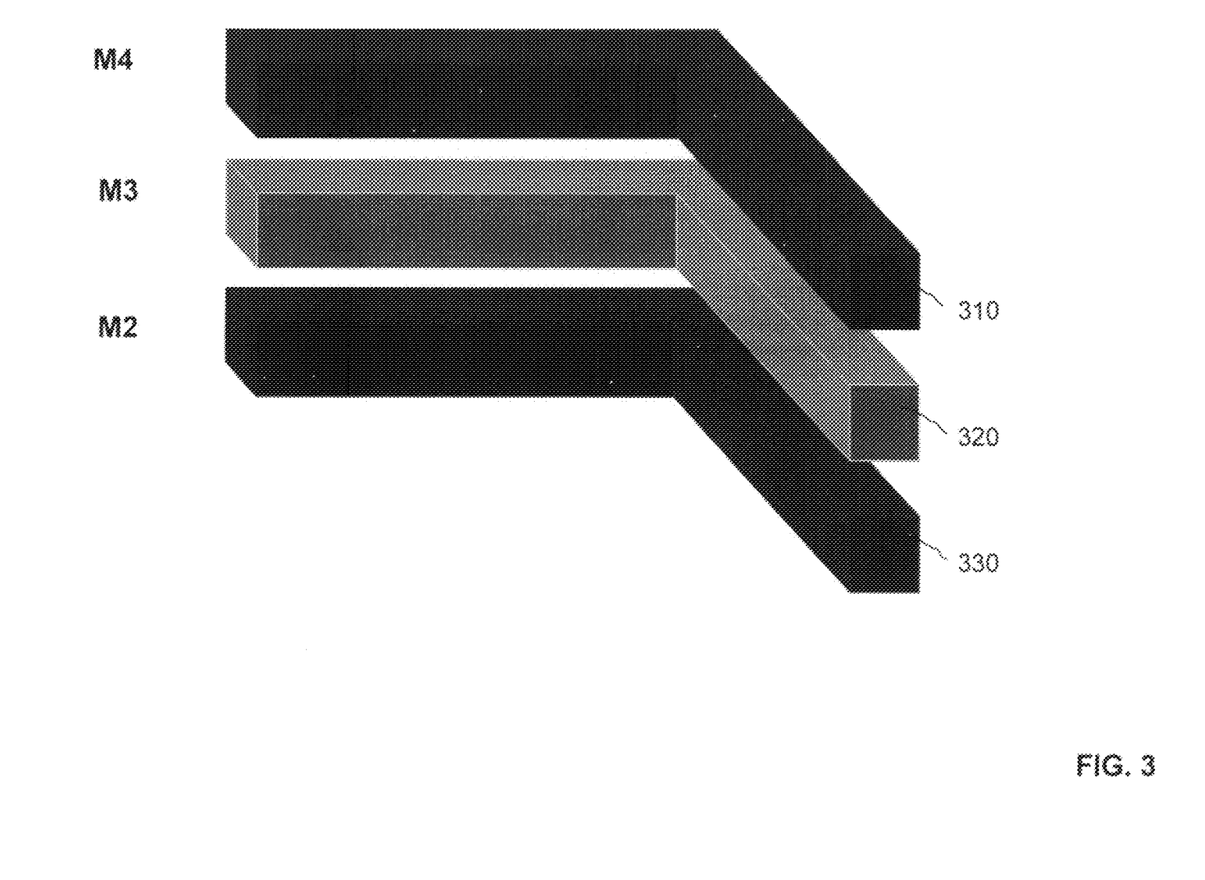
FIG. 3 illustrates a three dimensional view of L-shaped fingers from three layers of a semiconductor substrate.

A metal capacitor may be implemented using a single metal layer of a semiconductor substrate implemented with the configuration described. However, in order to increase the capacitance of a capacitor while maintaining a same area of space on the substrate, a plurality of metal layers may be implemented to form a stacked, multi-layered capacitor to save space. FIG. 3 illustrates a three dimensional view of L-shaped fingers from three layers of a semiconductor substrate. In this illustration, a first L-shaped segment 310 resides on a first metal layer M4, a second L-shaped segment 320 resides on a second metal layer M3, and a third L-shaped segment 330 resides on a third metal layer M2. L-shaped segments 310 and 330 may be biased at a first voltage level while L-shaped segment 320 is biased at a second voltage level.

Figure 4A:
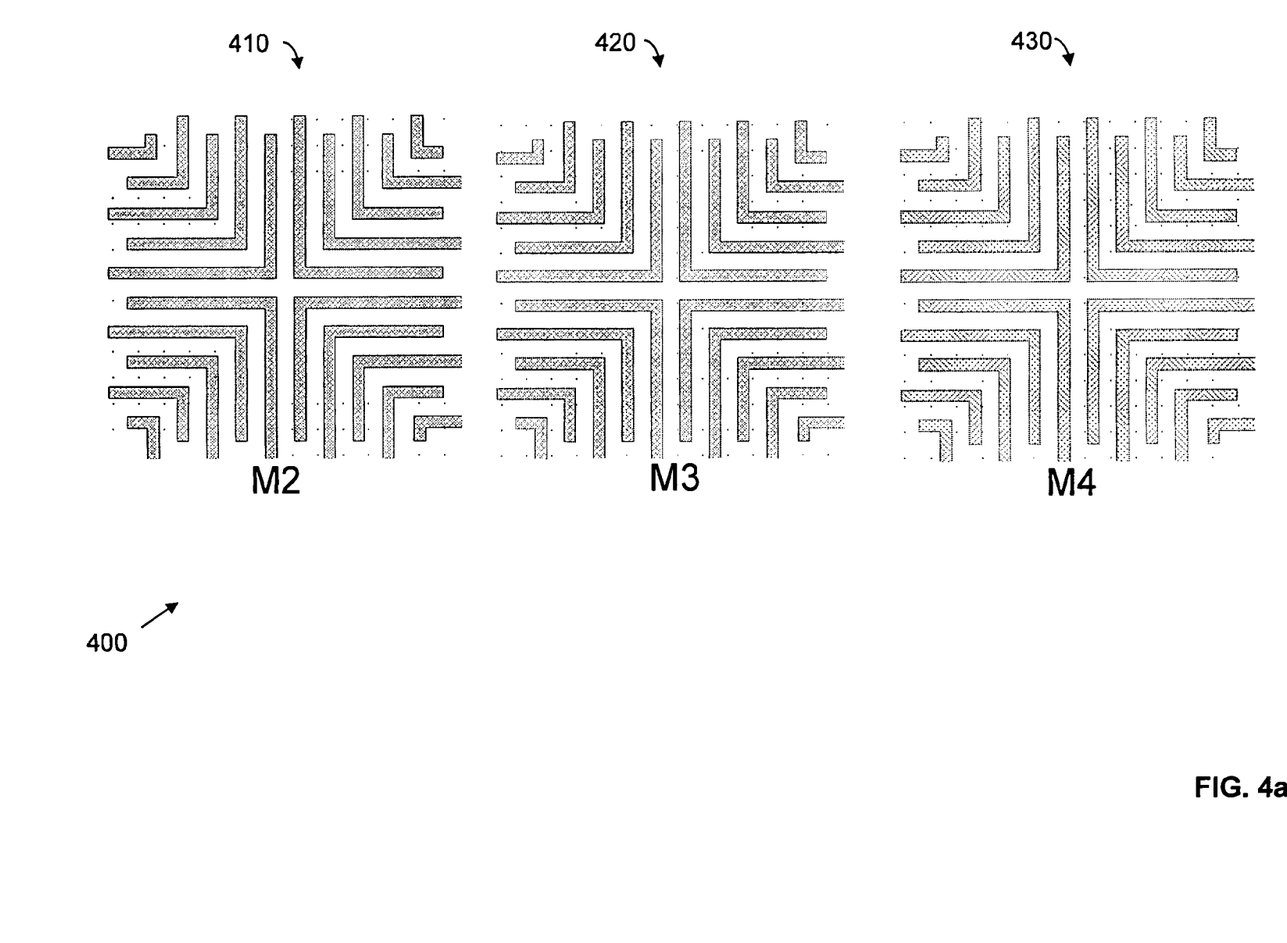
FIG. 4A illustrates L-shaped segments on a layout of a metal capacitor implemented on three metal layers of a semiconductor substrate according to an exemplary embodiment of the present invention.

FIG. 4A illustrates a layout of a metal capacitor 400 on three metal layers of a semiconductor substrate according to an exemplary embodiment of the present invention. The metal capacitor 400 illustrated in FIG. 4 is shown only with its L-shaped fingers and without any interconnect segments. As shown, the L-shaped fingers 410 on layer M2 of the capacitor 400 are configured identically in shape and position to the L-shaped fingers 420 on layer M3 and the L-shaped fingers 430 on layer M4 of the capacitor 400. The L-shaped fingers on each layer have an identical pattern and identical dimensions. As implemented, with M2, M3 and M4 stacked together, each finger on a metal layer is positioned to be adjacent to its corresponding finger on its neighboring metal layer. The adjacent fingers are biased at different voltage levels.

Figure 4B:
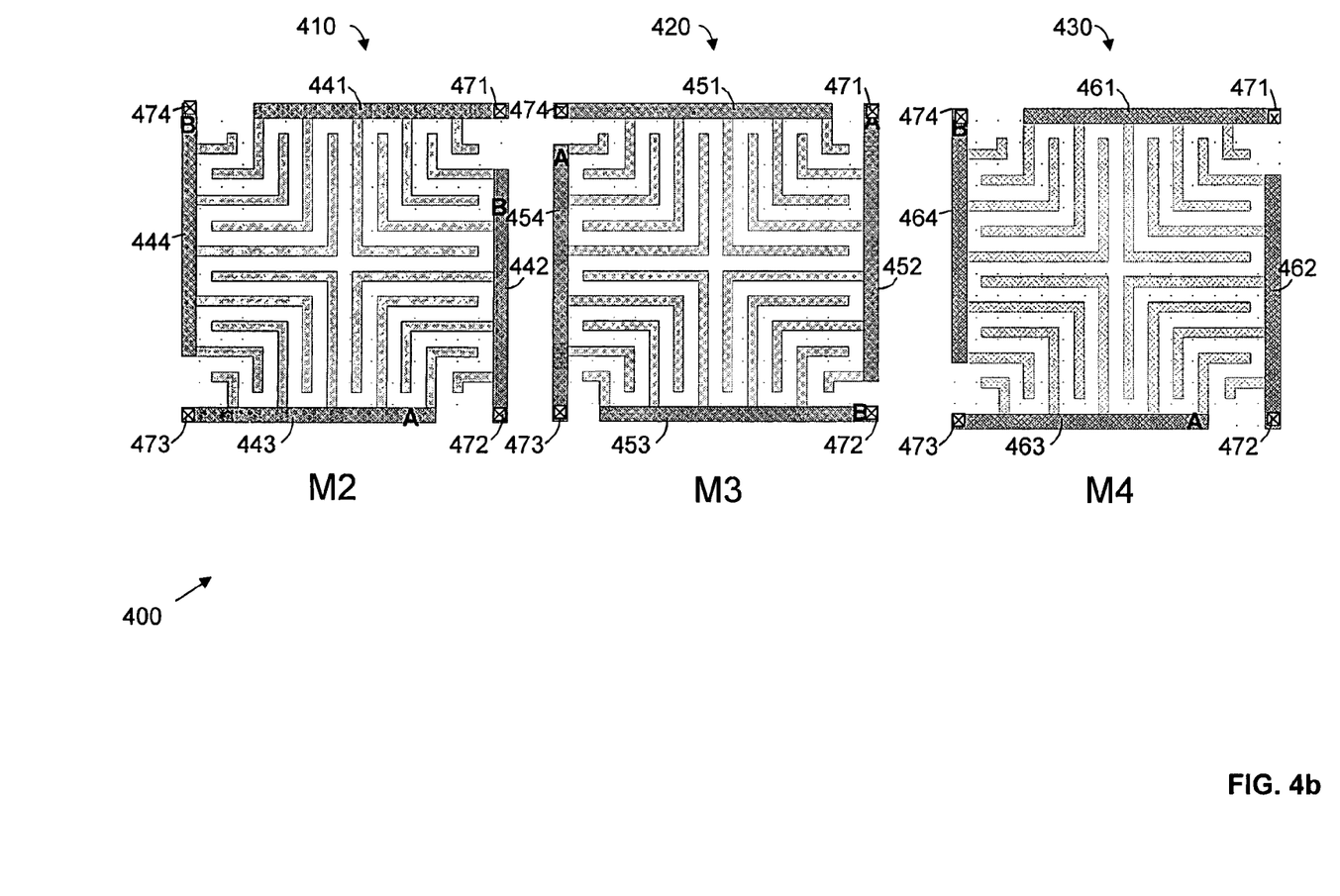
FIG. 4B illustrates L-shaped segments with interconnect segments on a layout of a metal capacitor implemented on three metal layers of a semiconductor substrate according to an exemplary embodiment of the present invention.

FIG. 4B illustrates L-shaped segments with interconnect segments on a layout of the metal capacitor 400 on three metal layers of a semiconductor substrate according to an exemplary embodiment of the present invention. As shown, on layer M2 of the capacitor 400, interconnect segments 441-444 are coupled to the sets of L-shaped fingers 410. Interconnect segments 441 and 443 are labeled with an "A" to denote that they are driven to a first voltage level by terminals 471 and 473 respectively. Interconnect segments 442 and 444 are labeled with a "B" to denote that they are driven to a second voltage level by terminals 472 and 474 respectively. On layer M3, interconnect segments 451-454 are coupled to the sets of L-shaped fingers 420. Interconnect segments 451 and 453 are labeled with a "B" to denote that they are driven to the second voltage level by terminals 474 and 472 respectively. Interconnect segments 452 and 454 are labeled with an "A" to denote that they are driven to the first voltage level by terminals 471 and 473 respectively. On layer M4 of the capacitor 400, interconnect segments 461-464 are coupled to the sets of L-shaped fingers 430. Interconnect segments 461 and 463 are labeled with an "A" to denote that they are driven to the first voltage level by terminals 471 and 473 respectively. Interconnect segments 462 and 464 are labeled with a "B" to denote that they are driven to the second voltage level by terminals 472 and 474 respectively. Terminals 471-474 may have contacts on each layer on the multi-layered capacitor 400. In one embodiment, terminals 471 and 473 may be connected to each other and terminals 472 and 474 may be connected to each other.

The capacitor structure described in FIGS. 2-4 can be configured to have a capacitance density that is comparable to capacitor structures using long parallel metal lines. The utilization of multiple partitions and L-shaped fingers provide shorter fingers which allow for embodiments of the invention to generate lower parasitic inductance effects at high frequencies than capacitors utilizing long parallel metal lines. Self inductance, which is proportional to line length, is reduced. For a given area used to implement a capacitor (cell size), embodiments of the present invention implements shorter lines resulting from the 4 partitions. Mutual inductance, which is proportional to the parallel length of two lines, is also reduced. The utilization of multiple partitions reduces mutual coupling inductance by shortening the line length. The utilization of L-shaped fingers reduces the parallel length that causes inductive coupling.

Compared to RTMOM capacitors, the capacitor structures described in FIGS. 2-4 can be configured to have a higher capacitance density for all configurations of width and spacing of the metal lines. The utilization of multiple partitions and L-shaped fingers provide shorter fingers which allow for embodiments of the present invention to generate lower parasitic inductance effects at high frequencies than RTMOM capacitors. Raphael simulations performed on RTMOM capacitors and L-shaped segmented metal capacitors (LSMC) yielded the following results.

| Raphael Simulation in 28 nm | | | |
| --- | --- | --- | --- |
| | | Capacitance density | |
| Width (nm) | Space (nm) | RTMOM (fF/um$^2$) | LSMC (fF/um$^2$) |
| 45 | 45 | 2.28 | 2.50 |
| 60 | 60 | 1.51 | 1.90 |
| 75 | 75 | 0.99 | 1.46 |

As seen from the table above, for metal lines/L-shaped fingers at widths 45, 60, and 70 nms and spaced at 45, 60, and 75 nms, capacitors with L-shaped fingers have higher capacitance densities than RTMOM capacitors.

Figure 5:
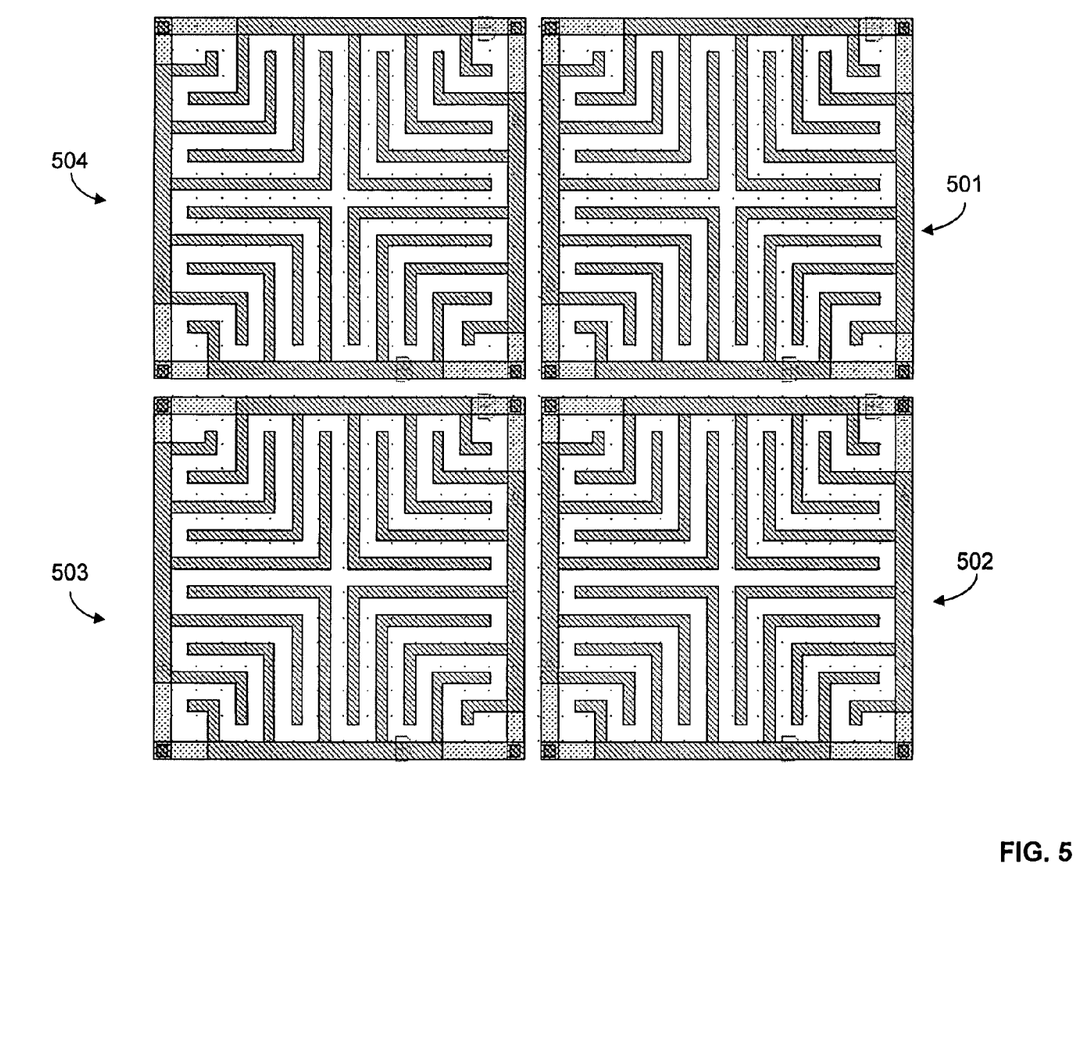
FIG. 5 illustrates an array of 4 capacitor cells according to an exemplary embodiment of the present invention.

FIG. 5 illustrates a capacitor structure 500 that includes an array of 4 capacitor cells 501-504 according to an exemplary embodiment of the present invention. Each of the capacitor cells 501-504 may be implemented by a capacitor such as the capacitor 200 shown in FIG. 2. The capacitor structure 500 allows for scaling where a system designer may configure one or more of the capacitor cells 501-504 to be coupled together in parallel to create a capacitor with a desired target capacitance value. By implementing a plurality of smaller capacitor cells 501-504 that utilize shorter fingers instead of a single large capacitor cell that utilizes larger fingers, lower parasitic inductance can be further achieved. The capacitor structure 500 also allows a system designer to comply with metal density design rules when adding shielding to protect the substrate from noise. Implementing individual smaller capacitor cells 501-504 with shielding plates from lower conducting layers such as metal 1 (M1) or polysilicon provides greater flexibility than implementing a large plate for a single large capacitor to meet the metal density requirement from chemical mechanical polishing (CMP) process.

In the foregoing specification, embodiments of the invention have been described with reference to specific exemplary embodiments thereof. It will, however, be evident that various modifications and changes may be made thereto without departing from the broader spirit and scope of the embodiments of the invention. For example, the capacitor utilizing L-shaped fingers is disclosed as being used in a transceiver block in an FPGA. It should be appreciated that the capacitor may be used in other applications and in other types of devices. Furthermore, the L-shaped fingers disclosed according to embodiments of the present invention may be also alternatively be implemented using one or more 90 degree segments of any length that resemble other shapes. In addition, although the metal capacitor described is illustrated as being in a square configuration, it should be appreciate that the interconnects of the capacitor may form other parallelograms or other shapes. Thus, the specification and drawings are, accordingly, to be regarded in an illustrative rather than restrictive sense.

What is claimed is:

1. A metal capacitor, comprising:
a first plurality of L-shaped fingers, residing on a first layer of a semiconductor substrate, connected together and driven to a first voltage level by a first interconnect segment;
a second plurality of L-shaped fingers, residing on the first layer of the semiconductor substrate, connected together and driven to a second voltage level by a second interconnect segment;
a third plurality of L-shaped fingers, residing on the first layer of the semiconductor substrate, connected together and driven to the first voltage level by a third interconnect segment; and
a fourth plurality of L-shaped fingers, residing on the first layer of the semiconductor substrate, connected together and driven to the first voltage level by a fourth interconnect segment, wherein the first interconnect segment, the second interconnect segment, the third interconnect segment, and the fourth interconnect segment have a same length, have a same width, reside on the first layer of the semiconductor substrate, and are physically detached from each other on the first layer, wherein the first interconnect segment, the second interconnect segment, the third interconnect segment, and the fourth interconnect segment form a square configuration.

2. The apparatus of claim 1, wherein the first plurality of L-shaped fingers and the second plurality of L-shaped fingers have identical patterns.

3. The apparatus of claim 1, wherein the first and second interconnect segments contribute parasitic capacitance to the metal capacitor.

4. The apparatus of claim 1, wherein only the plurality of L-shaped fingers contribute to the capacitor density of the metal capacitor.

5. The apparatus of claim 1, wherein each of the L-shaped fingers from a set of the first plurality of L-shaped fingers is adjacent to at least one of the L-shaped fingers from a set of the second plurality of L-shaped fingers.

6. The apparatus of claim 1, wherein the first plurality of L-shaped fingers have a same dimension as the second plurality of L-shaped fingers.

7. The apparatus of claim 1, wherein the first plurality of L-shaped fingers are not directly coupled to another layer.

8. The apparatus of claim 1, wherein the first interconnect segment is not coupled to a finger coupled to another interconnect segment.

9. A metal capacitor array structure, comprising:
a plurality of metal capacitors each having a first plurality of L-shaped fingers driven to a first voltage level by a first interconnect segment, a second plurality of L-shaped fingers driven to a second voltage level by a second interconnect segment positioned 90 degrees from the first interconnect segment, a third plurality of L-shaped fingers drive to a first voltage level by a third interconnect segment, and a fourth plurality of L-shaped fingers driven to second voltage level by a fourth interconnect segment, wherein the first, second, third, and fourth interconnect segments have identical physical dimensions, and wherein the first, second, third, and fourth interconnect segments reside on a same layer of a semiconductor substrate and are physically detached from each other on the layer of the semiconductor substrate.

10. The apparatus of claim 9, wherein the plurality of metal capacitors are configurable to connect one or more of the plurality of metal capacitors in parallel to satisfy a target capacitance value.

11. The apparatus of claim 9, wherein the first plurality and second plurality of L-shaped fingers contribute to a capacitor density of the metal capacitors without contributing to a parasitic capacitance of the metal capacitors.

12. The apparatus of claim 9, wherein each of the L-shaped fingers from a set of the first plurality of L-shaped fingers from a first capacitor is adjacent to at least one of the L-shaped fingers from a set of the second plurality of L-shaped fingers from the first capacitor.

* * * * *